(12) United States Patent
Choi et al.

(10) Patent No.: US 8,382,966 B2
(45) Date of Patent: Feb. 26, 2013

(54) SPUTTERING SYSTEM

(75) Inventors: Seung-Ho Choi, Yongin (KR); Suk-Won Jung, Yongin (KR); Young-Mook Choi, Yongin (KR); Hyun-Keun Song, Yongin (KR)

(73) Assignee: Samsung Display Co., Ltd. (KR)

( * ) Notice: Subject to any disclaimer, the term of this patent is extended or adjusted under 35 U.S.C. 154(b) by 353 days.

(21) Appl. No.: 12/825,285

(22) Filed: Jun. 28, 2010

(65) Prior Publication Data

US 2011/0168553 A1    Jul. 14, 2011

(30) Foreign Application Priority Data

Jan. 11, 2010   (KR) .......................... 10-2010-0002243

(51) Int. Cl.
  *C23C 14/35*    (2006.01)
(52) U.S. Cl. ........................ 204/298.18; 298/7; 298/15
(58) Field of Classification Search ............. 204/298.18, 204/298.07, 298.12, 192.12, 192.1
See application file for complete search history.

(56) References Cited

U.S. PATENT DOCUMENTS

| | | | | |
|---|---|---|---|---|
| 4,597,847 | A * | 7/1986 | Boys ........................ | 204/298.12 |
| 4,842,708 | A * | 6/1989 | Kadokura et al. ........ | 204/298.16 |
| 5,328,583 | A * | 7/1994 | Kameyama et al. ...... | 204/192.12 |
| 5,346,600 | A * | 9/1994 | Nieh et al. ................. | 204/192.3 |
| 5,558,749 | A * | 9/1996 | Yokoyama et al. ....... | 204/192.12 |
| 6,051,113 | A * | 4/2000 | Moslehi ................... | 204/192.12 |

(Continued)

FOREIGN PATENT DOCUMENTS

| | | |
|---|---|---|
| JP | 2008235089 | 10/2008 |
| KR | 10-2007-0018895 A | 2/2007 |

(Continued)

OTHER PUBLICATIONS

Registration Determination Certificate in corresponding Korean Patent application No. 10-2009-0111538 mailed on Nov. 30, 2011.

(Continued)

*Primary Examiner* — Keith Hendricks
*Assistant Examiner* — Stefanie Sherrill
(74) *Attorney, Agent, or Firm* — Knobbe Martens Olson & Bear LLP (57) ABSTRACT

A sputtering system is disclosed. The sputtering system includes: a first sputter unit including: a first deposition material plate, a second deposition material plate, where the first and second deposition material plates face each other, and a first magnetic field generator disposed behind each of the first deposition material plate and the second deposition material plate, configured to generate a magnetic field, a second sputter unit including: a third deposition material plate, disposed next to the first deposition material plate, a fourth deposition material plate, disposed next to the second deposition plate, where the third and fourth deposition material plates face each other, and a second magnetic field generator disposed behind each of the third deposition material plate and the fourth deposition material plate, configured to generate a magnetic field, a first gas supply pipe disposed between the first and third deposition material plates, configured to discharge gas to the second and fourth deposition material plates, a second gas supply pipe disposed between the second fourth deposition material plates, configured to discharge gas to the first and third deposition material plates, a first substrate support unit, configured to support a first deposition substrate, oriented toward outer edges of the first and second deposition material plates, and a second substrate support unit, configured to support a second deposition substrate, oriented toward outer edges of the third and fourth deposition material plates.

16 Claims, 10 Drawing Sheets

U.S. PATENT DOCUMENTS

| | | | |
|---|---|---|---|
| 2005/0011756 A1* | 1/2005 | Shibamoto et al. | 204/298.07 |
| 2005/0016834 A1* | 1/2005 | Sawamura | 204/192.12 |
| 2008/0210556 A1* | 9/2008 | Takasawa et al. | 204/298.16 |
| 2008/0245657 A1* | 10/2008 | Takasawa et al. | 204/192.12 |
| 2009/0195147 A1 | 8/2009 | Song et al. | |

FOREIGN PATENT DOCUMENTS

| | | |
|---|---|---|
| KR | 10-2008-0002978 A | 1/2008 |
| KR | 10-2008-0045031 A | 5/2008 |
| KR | 1020080064125 | 8/2008 |
| KR | 1020090084528 | 5/2009 |

OTHER PUBLICATIONS

Registration Determination Certificate mailed on Nov. 30, 2011 in Korean priority Patent application No. 10-2010-0002243.

* cited by examiner

SPUTTERING SYSTEM

CROSS-REFERENCE TO RELATED APPLICATIONS

This application claims the benefit of Korean Patent Application No. 10-2010-0002243, filed on Jan. 11, 2010, in the Korean Intellectual Property Office, the disclosure of which is incorporated herein in its entirety by reference.

BACKGROUND

1. Field

The field generally relates to a sputtering system, and more particularly, to a sputtering system configured to achieve uniform sputtering and deposition.

2. Description of the Related Technology

There are sputtering methods used for forming an inorganic layers such as metal layers, transparent conductive layers, or the like. In these sputtering methods, a rare gas such as argon (Ar) gas is introduced into a vacuum vessel, and a direct current (DC) voltage or a radio frequency (RF) voltage of more than 150 V is supplied to a cathode including a sputtering deposition material plate, and a layer is formed through slow discharge of the gas.

Sputtering methods are generally used in a layer forming process during manufacturing of flat panel display (FPD) devices, such as to form a thin film transistor (TFT) liquid crystal display (LCD) device or an organic electroluminescent light emitting display device, or various other electronic devices. These sputtering methods are classified as dry process techniques, and have a wide range of applications.

When an inert gas such as Ar, for example, which is used for a plasma source, is ionized, the surface of a deposition material plate is pressurized, and when the material is vaporized, reflection may occur. Also, when an oxide-based material is sputtered, anions of oxygen or other molecules with large energy reach a deposition substrate due to a strong repulsive force from a cathode. In these sputtering methods, particles are in a high-energy state of several eV or more. When particles with large kinetic energy reach the deposition substrate, the surface of the deposition substrate may be damaged, or a thin film formed on the surface of the substrate may be sputtered.

For example, when an inorganic layer is sputtered on an organic layer, so as to form upper electrodes of organic electroluminescent light emitting display devices, or electrodes of organic thin film transistors, particles having high energy of 100 eV or more generated in the sputtering processes collide with the organic layer and damage the organic layer.

In order to reduce such damage to the organic layer, some existing systems and processes attempt to intercept the access of ions by disposing a grid having a predetermined electric potential between the deposition material plate and the deposition substrate. Other existing systems and processes attempt to minimize the effect of plasma by applying a bias voltage to the deposition substrate; such systems may not completely eliminate the effect of the plasma.

SUMMARY OF CERTAIN INVENTIVE ASPECTS

Embodiments of the present invention provide a sputtering system in which thin films are efficiently and simultaneously deposited on a plurality of substrates.

In embodiments of the sputtering system disclosed, particles with high generated energy do not collide with a substrate, thereby preventing damage to a thin film layer such as an organic layer formed on the substrate.

One aspect is a sputtering system including: a first sputter unit including: a first deposition material plate, a second deposition material plate, where the first and second deposition material plates face each other, and a first magnetic field generator disposed behind each of the first deposition material plate and the second deposition material plate, configured to generate a magnetic field, a second sputter unit including: a third deposition material plate, disposed next to the first deposition material plate, a fourth deposition material plate, disposed next to the second deposition plate, where the third and fourth deposition material plates face each other, and a second magnetic field generator disposed behind each of the third deposition material plate and the fourth deposition material plate, configured to generate a magnetic field, a first gas supply pipe disposed between the first and third deposition material plates, configured to discharge gas to the second and fourth deposition material plates, a second gas supply pipe disposed between the second fourth deposition material plates, configured to discharge gas to the first and third deposition material plates, a first substrate support unit, configured to support a first deposition substrate, oriented toward outer edges of the first and second deposition material plates, and a second substrate support unit, configured to support a second deposition substrate, oriented toward outer edges of the third and fourth deposition material plates.

Another aspect is a sputtering system including: a first sputter unit including: a first and a second deposition material plate facing each other, and a first magnetic field generator including: an outer magnet portion disposed behind each plate, a central magnet portion disposed over a center of a rear surface of each plate, where the outer magnet portion is configured to generate a stronger magnetic field than the central magnet portion, and a yoke plate, including a groove for the outer magnet portion to surround the deposition material plate, disposed between each plate and the outer magnet portion, configured to deflect a magnetic field, a second sputter unit including: a third and a fourth deposition material plate facing each other, and a second magnetic field generator including: an outer magnet portion disposed behind each plate, a central magnet portion disposed over a center of a rear surface of each plate, where the outer magnet portion is configured to generate a stronger magnetic field than the central magnet portion, and a yoke plate, including a groove for the outer magnet portion to surround the deposition material plate, disposed between each plate and the outer magnet portion, configured to deflect a magnetic field, where the third deposition material plate is placed next to the first deposition plate and the fourth deposition material plate is placed next to the second deposition plate, and shield units disposed in front of edges of each of the first, second, third and fourth deposition material plates, configured to generate discharge to the respective material plates, where the shield units include the same material as a material to be deposited on the first and second deposition substrates, where a voltage is supplied to said system in a form selected from the group consisting of a direct current (DC) voltage, a pulse DC voltage, and a radio frequency (RF) voltage applied to the shield units and the first, second, third and fourth deposition material plates.

BRIEF DESCRIPTION OF THE DRAWINGS

The above and other features and advantages of the present invention will become more apparent by describing in detail certain exemplary embodiments thereof with reference to the attached drawings in which.

DETAILED DESCRIPTION OF CERTAIN INVENTIVE EMBODIMENTS

In the following detailed description, only certain exemplary embodiments of the present invention have been shown and described with reference to the attached drawings. As those skilled in the art would realize, the described embodiments may be modified in various ways without departing from the spirit or scope of the present invention. Accordingly, the drawings and description are to be regarded as illustrative in nature and not restrictive. Like reference numerals generally refer to like elements throughout the description and drawings.

Figure 1:
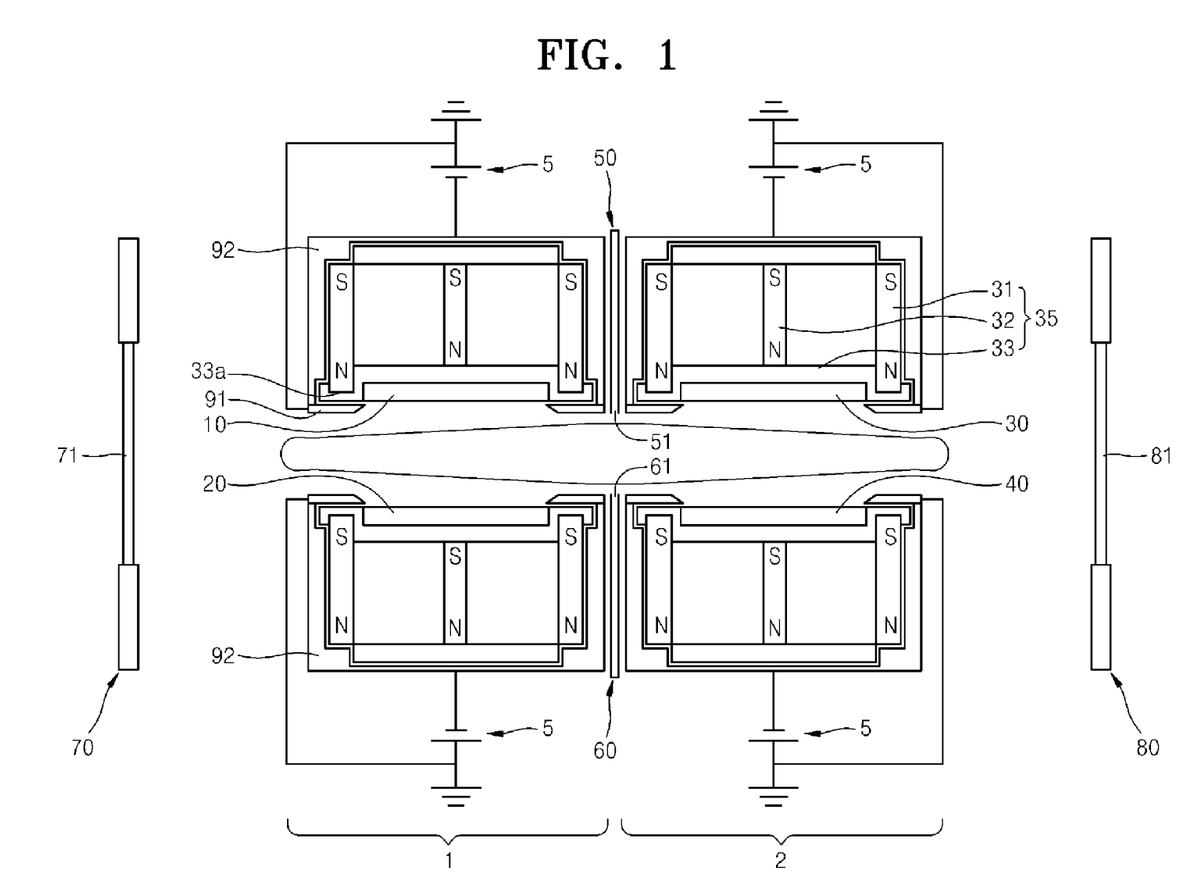
FIG. 1 is a schematic view of an embodiment of a sputtering system.

FIG. 1 is a schematic view of an embodiment of a sputtering system. Referring to FIG. 1, an embodiment of the sputtering system includes a first sputter unit 1 including a first deposition material plate 10, a second deposition material plate 20, and a magnetic field generator 35; a second sputter unit 2 including a third deposition material plate 30, a fourth deposition material plate 40, and another magnetic field generator 35; a first gas supply pipe 50; a second gas supply pipe 60; a first substrate support unit 70; and a second substrate support unit 80.

In some embodiments, the sputtering system of FIG. 1 may be disposed in a chamber that is blocked from the external air (not shown). The chamber may be connected to a vacuum pump (not shown) for maintaining the chamber in a vacuum state and the chamber may surround elements, such as the first sputter unit 1, the second sputter unit 2, the first substrate support unit 70, and the second substrate support unit 80, of the sputtering system.

In one embodiment, the first sputter unit 1 may include a first deposition material plate 10 and a second deposition material plate 20 that face each other, and a magnetic field generator 35 that is disposed behind the first deposition material plate 10 and the second deposition material plate 20, and generates a magnetic field.

In one embodiment, the second sputter unit 2 may have the same structure as that of the first sputter unit 1. The second sputter unit 2 may include a third deposition material plate 30 and a fourth deposition material plate 40 that face each other, and a magnetic field generator 35 that is disposed behind the third deposition material plate 30 and the fourth deposition material plate 40 and generates a magnetic field. In one embodiment, the third deposition material plate 30 may be disposed next to the first deposition material plate 10, and the fourth deposition material plate 40 may be disposed next to the second deposition material plate 20.

In some embodiments, the first deposition material plate 10, the second deposition material plate 20, the third deposition material plate 30, and the fourth deposition material plate 40 may include material to be deposited on a first deposition substrate 71 and material to be deposited on a second deposition substrate 81. For example, for manufacturing an organic light emitting display device, the first deposition material plate 10, the second deposition material plate 20, the third deposition material plate 30, and the fourth deposition material plate 40 may include various metals such as aluminum (Al), molybdenum (Mo), copper (Cu), gold (Au), platinum (Pt) or the like, for forming a source electrode, a drain electrode, a gate electrode, and the like, of a thin film transistor (TFT) of the organic light emitting display device, and an alloy thereof. In some embodiments, the first, second, third, and fourth deposition material plates 10, 20, 30, and 40 may include indium-tin oxide (ITO), indium-zinc oxide (IZO), indium oxide (IO), ZnO, tin-zinc oxide (TZO), AZO, GZO or the like, for forming a layer of an anode, a common electrode, and the like of an organic light emitting layer.

Still referring to FIG. 1, in some embodiments, the first gas supply pipe 50 may be disposed between the first deposition material plate 10 and the third deposition material plate 30, and may discharge gas to the second deposition material plate 20 and the fourth deposition material plate 40 via a supply nozzle 51. The second gas supply pipe 60 may be disposed between the second deposition material plate 20 and the fourth deposition material plate 40 and may discharge gas to the first deposition material plate 10 and the third deposition material plate 30 via a supply nozzle 61. Gases supplied by the first gas supply pipe 50 and the second gas supply pipe 60 may include krypton (Kr), xenon (Xe), argon (Ar), or a mixed gas of Ar and oxygen ($O_2$).

Shield units 91 may be disposed in the front of the first deposition material plate 10, the second deposition material plate 20, the third deposition material plate 30, and the fourth deposition material plate 40. Each of the shield units 91 may be grounded and may be perform the function of an anode. In some embodiments, a negative voltage generated by a power supply unit 5 is applied to each of the first deposition material plate 10, the second deposition material plate 20, the third deposition material plate 30, and the fourth deposition material plate 40, such that the first, second, third and fourth deposition material plates 10, 20, 30, and 40 may perform the function of a cathode. Each of the shield units 91 may include the same material as a sputter material, thereby thus preventing contamination.

The power supply unit 5 may generate a direct current (DC) voltage a radio frequency (RF) voltage, a pulse direct current (DC) voltage power, or the like.

Still referring to FIG. 1, in some embodiments, the first sputter unit 1 and the second sputter unit 2 may each include the magnetic field generator 35 that is disposed behind the first deposition material plate 10, the second deposition material plate 20, the third deposition material plate 30, and the fourth deposition material plate 40, and generates a magnetic field. The magnetic field generator 35 may include an outer magnet portion 31. The outer magnet portion 31 may be in the shape of a ring that surrounds the edge surface of each of the first deposition material plate 10, the second deposition material plate 20, the third deposition material plate 30, and the fourth deposition material plate 40. The magnetic field generator 35 may further include a central magnet portion 32 that is disposed over the center of a rear surface of each of the first deposition material plate 10, the second deposition material plate 20, the third deposition material plate 30, and the fourth deposition material plate 40. The central magnet portion 32 may be in the shape of a bar magnet, for example. In some embodiments, the outer magnet portion 31 may generate a stronger magnetic field than that of the central magnet portion 32.

In some embodiments, the directions of magnetic poles of the outer magnet portion 31 and of the central magnet portion 32 are arranged to be perpendicular to surfaces of the first deposition material plate 10, the second deposition material plate 20, the third deposition material plate 30, and the fourth deposition material plate 40. The direction of the magnetic pole of the magnetic field generator 35 disposed behind the first deposition material plate 10 is set to be opposite to the direction of the magnetic pole of the magnetic field generator 35 disposed behind the second deposition material plate 20, so that a magnetic field for connecting the first deposition material plate 10 and the second deposition material plate 20 may be formed.

As illustrated in the embodiment of FIG. 1, the outer magnet portion 31 and the central magnet portion 32 disposed behind the first deposition material plate 10 may have an N-pole downwards, and the outer magnet portion 31 and the central magnet portion 32 disposed behind the second deposition material plate 20 may have an S-pole upwards.

Similarly, the direction of the magnetic pole of the magnet field generator 35 disposed behind the third deposition material plate 30 may be set to be opposite to the direction in of the magnetic pole of the magnetic field generator 35 disposed behind the fourth deposition material plate 40, so that a magnetic field for connecting the third deposition material plate 30 and the fourth deposition material plate 40 may be formed.

Still referring to FIG. 1, the magnetic field generator 35 may further include a yoke plate 33. The yoke plate 33 may be plate-shaped and disposed between each of the first deposition material plate 10, the second deposition material plate 20, the third deposition material plate 30, and the fourth deposition material plate 40 and the respective outer magnet portion 31. The yoke plate 33 may be formed of magnetic material due to the outer magnet portion 31 and the central magnet portion 32. In some embodiments, the yoke plate 33 may be formed of a ferromagnetic material including at least one of iron (Fe), cobalt (Co), nickel (Ni), and an alloy thereof.

The yoke plate 33 may make the magnetic field formed by the outer magnet portion 31 and the central magnet portion 32 more uniform by deflecting a direction of the magnetic field to be perpendicular to surfaces of the first deposition material plate 10, the second deposition material plate 20, the third deposition material plate 30, and the fourth deposition material plate 40. The magnetic field formed perpendicular to the surfaces of the deposition material plates 10, 20, 30 and 40 due to the yoke plate 33 will be described below.

In some embodiments, the yoke plate 33 may include a groove 33a for the respective outer magnet portion 31 to surround the deposition material plates 10, 20, 30, 40. With the yoke plate 33 surrounding the lower edges of the deposition material plates 10, 20, 30, and 40, a strong magnetic field is formed at the edges of the deposition material plates 10, 20, 30, and 40 and a region of plasma may thus be limited to a space between the first, second, third, and fourth deposition material plates 10, 20, 30, and 40.

The outer magnet portion 31 and the central magnet portion 32 may each be formed of a ferromagnetic material such as a ferrite-based, neodymium-based (for example, neodymium (Nd), Fe, boron (B), etc.) magnet, a samarium cobalt-based magnet, or the like.

In some embodiments, the first, second, third, and fourth deposition material plates 10, 20, 30, and 40, the magnetic field generators 35, and the shield units 91 may be surrounded by a case 92 having an opening formed in a side thereof. The first, second, third, and fourth deposition material plates 10, 20, 30, and 40 may be disposed in the case 92 to be exposed to the outside through the opening of the case 92, and the shield units 91 may be disposed at a front surface of the case 92 in the front of edges of the first, second, third, and fourth deposition material plates 10, 20, 30, and 40.

As shown in FIG. 1, a first substrate support unit 70 may be disposed outside the first sputter unit 1 so as to be oriented to outer edges of the first and second deposition material plates 10 and 20. The first substrate support unit 70 supports the first deposition substrate 71. A second substrate support unit 80 may be disposed outside the second sputter unit 2 so as to be oriented to outer edges of the third and fourth deposition material plates 30 and 40. The second substrate support unit 80 supports the second deposition substrate 81.

In embodiments where a negative voltage generated by the power supply unit 5 is applied to each of the first, second, third, and fourth deposition material plates 10, 20, 30, and 40, with each deposition material platefunctioning as a cathode, discharge occurs, and electrons generated due to the discharge collide with an Ar gas in the chamber so that $Ar^+$ ions and plasma may be generated. Plasma may be confined in a space between the first deposition material plate 10 and the second deposition material plate 20 and in a space between the third deposition material plate 30 and the fourth deposition material plate 40 due to the magnetic field generated by the magnetic field generator 35, as described above. Plasma may include gamma—electrons, negative ions, positive ions, or the like.

Electrons in plasma generated by the first sputter unit 1 and the second sputter unit 2 form high-density plasma while making a rotating motion along a magnetic force line between the first, second, third, and fourth deposition material plates 10, 20, 30, and 40 that face one another. Electrons in plasma may simultaneously sustain the high-density plasma while making a reciprocating motion due to the negative voltage applied to each of the first, second, third, and fourth deposition material plates 10, 20, 30, and 40.

All electrons or ions formed in plasma or formed due to the negative voltage applied to each of the first, second, third, and fourth deposition material plates 10, 20, 30, and 40 make a rotating motion along the magnetic force line between the first, second, third, and fourth deposition material plates 10, 20, 30, and 40, and similarly, ion particles having electric charges, such as gamma—electrons, negative ions, positive ions, or the like, make a reciprocating motion along the magnetic force line between the first, second, third, and fourth deposition material plates 10, 20, 30, and 40. Thus, the ion particles having high energy of 100 eV are accelerated to the opposite deposition material plates 10, 20, 30, and 40 and are confined in plasma formed in a space between the first, second, third, and fourth deposition material plates 10, 20, 30, and 40.

In some embodiments, the high energy ion particles sputtered from one of the first, second, third, and fourth deposition material plates 10, 20, 30, and 40 are accelerated to any of the opposite deposition material plates 10, 20, 30, and 40 so that a thin film may be formed by diffusion of neutral particles having relatively small energy without any effect on the first deposition substrate 71 and the second deposition substrate 81.

Since gas is uniformly supplied to the space between the first, second, third, and fourth deposition material plates 10, 20, 30, and 40 via the first gas supply pipe 50 disposed between the first deposition material plate 10 and the third deposition material plate 30 and the second gas supply pipe 60 disposed between the second deposition material plate 20 and the fourth deposition material plate 40, plasma may be uniformly formed. Such uniform plasma formation helps achieve adequate deposition on the first and second deposition substrates 71 and 81.

When comparing the embodiment of the sputtering system of FIG. 1 to a conventional sputtering system, damage by plasma, i.e., damage to a substrate due to collision of particles having high energy may be reduced, and a thin film having higher quality may be formed on the substrate. In the embodiment of the sputtering system of FIG. 1, both of the first sputter unit 1 and the second sputter unit 2 operate so that a thin film forming process may be simultaneously performed on the first and second deposition substrates 71 and 81 and the speed of production may be greatly increased compared to convention sputtering systems.

Figure 2:
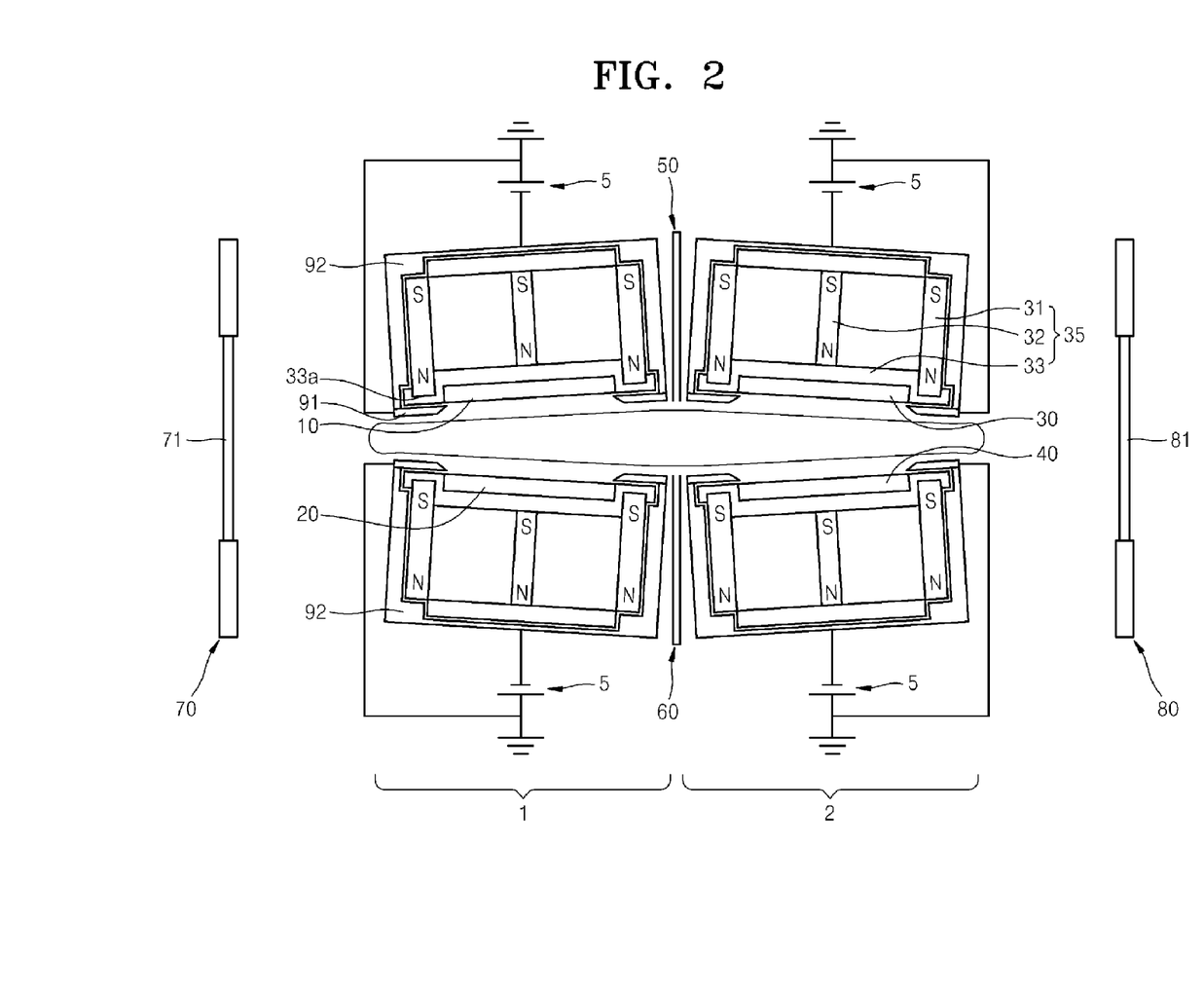
FIG. 2 is a schematic view of another embodiment of a sputtering system.

FIG. 2 is a schematic view of another embodiment of a sputtering system. Elements of the embodiment of the sputtering system of FIG. 2 are the same as those of the embodiment of the sputtering system of FIG. 1, and thus the same reference numerals are used.

Referring to FIG. 2, relative positions of a first deposition material plate 10 and a second deposition material plate 20 and relative positions of a third deposition material plate 30 and a fourth deposition material plate 40 are different than in FIG. 1. Outer edges of the first deposition material plate 10 and the second deposition material plate 20 oriented to a first substrate support unit 70 are set to be closer to each other. At least one of the first deposition material plate 10 and the second deposition material plate 20 is arranged to be inclined at a predetermined angle so that the first deposition material plate 10 and the second deposition material plate 20 may be closer to each other and to the first substrate support unit 70. Outer edges of the third deposition material plate 30 and the fourth deposition material plate 40 oriented to a second substrate support unit 80 are set to be closer to each other. At least one of the third deposition material plate 30 and the fourth deposition material plate 40 is arranged to be inclined at a predetermined angle so that the third deposition material plate 30 and the fourth deposition material plate 40 may be closer to each other and to the second substrate support unit 80.

In some embodiments, the first deposition material plate 10 and the second deposition material plate 20 may form a predetermined angle so that they may be closer to each other and to a first deposition substrate 71, and the third deposition material plate 30 and the fourth deposition material plate 40 may form a predetermined angle so that they may be closer to each other and to a second deposition substrate 81. In such embodiments, the region of plasma may be more limited to a space between the first, second, third, and fourth deposition material plates 10, 20, 30, and 40.

The deposition material plates 10, 20, 30 and 40 may be arranged so that inclination angles of their front surfaces may be adjusted. In some embodiments, a case 92 that supports the first, second, third, and fourth deposition material plates 10, 20, 30, and 40 may be rotatable by a driving unit such as a motor (not shown). The case 92 may be rotated so that the inclination angles of the first, second, third, and fourth deposition material plates 10, 20, 30, and 40 may be optimally adjusted according to the magnetic field generated by a magnetic field generator 35.

Figure 3:
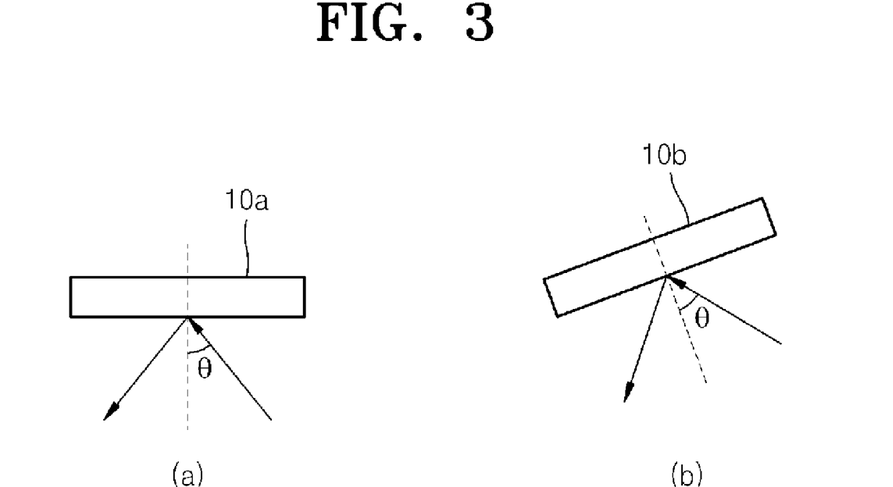
FIG. 3 illustrates trajectories of accelerated particles in the embodiments of FIGS. 1 and 2 of the sputtering system of FIG. 1 or 2.

FIG. 3 illustrates trajectories of accelerated particles in the embodiments of FIGS. 1 and 2 of the sputtering system of FIG. 1 or 2.

Referring to FIG. 3 (a), in embodiments where the accelerated particles collide with deposition material plate 10a that are disposed in parallel, like in the embodiment of the sputtering system illustrated in FIG. 1, at an incidence angle θ, particles of material for forming a deposition material plate 10a are ejected from the deposition material plate 10a or are scattered due to the elastic or non-elastic collision of the particles with the deposition material plate 10a so that a flow of particles of cos θ with respect to a normal to the surface of the deposition material plate 10a may occur. In such embodiments, an angle is set such that the particles of the material for forming the deposition material plate 10a are ejected from the deposition material plate 10a to outside of the deposition material plate 10a and the accelerated particles may proceed toward a deposition substrate.

Referring to FIG. 3 (b), in embodiments where the deposition material plates 10b are disposed to be inclined at a predetermined angle so that the deposition material plates 10b may be closer to one another and the outside, that is, in a direction towards a deposition substrate, like in the embodiment of the sputtering system illustrated in FIG. 2, even when accelerated particles form the same incidence angle θ and collide with one of the deposition material plates 10b, the accelerated particles are scattered toward the center of the sputtering system, as compared to the case where the accelerated particles collide with the deposition material plate 10a illustrated in FIG. 3 (a). Even when the accelerated particles with high energy are scattered on the surface of the deposition material plate 10b, a possibility where the accelerated particles exit from the sputtering system is greatly reduced. Thus, damage to a substrate due to collision of the accelerated particles with high energy may be prevented. Thus, when embodiments of the sputtering system as illustrated in FIG. 1 or 2 are used, sputtering to a large-scaled substrate may be performed with no damage to the substrate.

Figure 4:
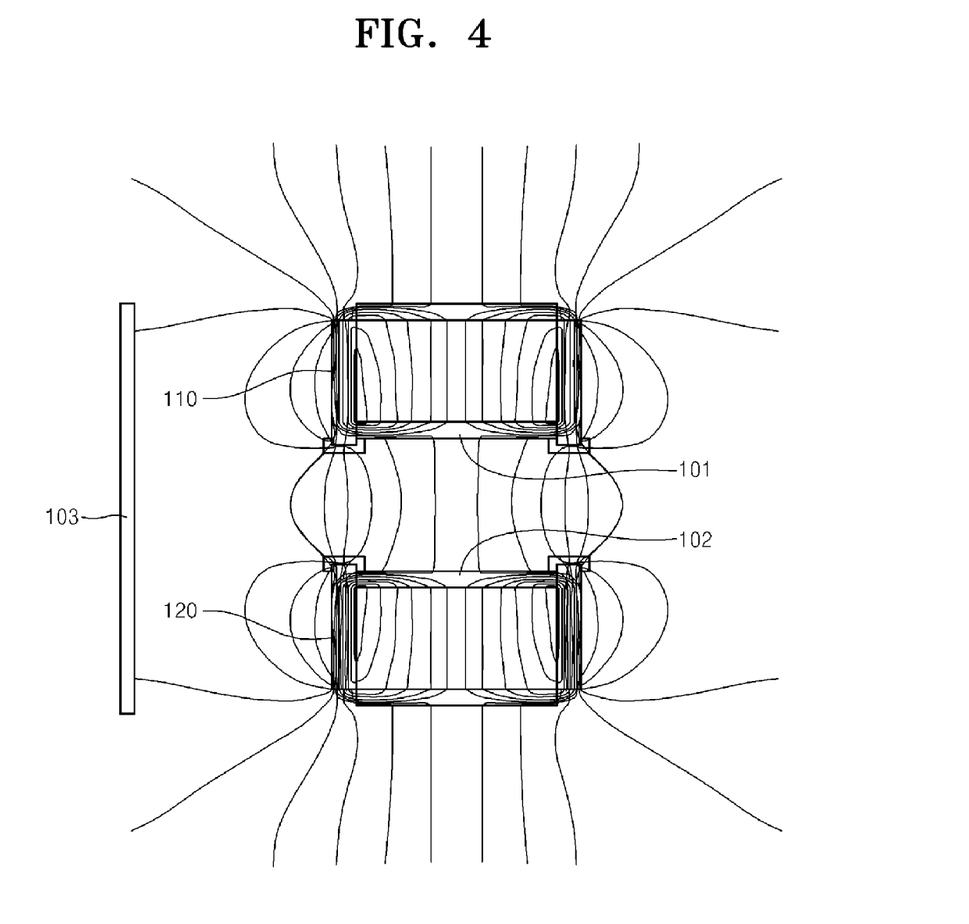
FIG. 4 illustrates the magnetic fields of a sputtering system not including embodiments of the current invention.

FIG. 4 illustrates the magnetic fields of a sputtering system not including embodiments of the current invention, as a comparative example. The comparative example of FIG. 4 is a system using one sputter unit. Even when the magnets 110 and 120 disposed behind deposition material plates 101 and 102, and the intensity of a magnetic force are optimized so as to limit the region of plasma in a space between the deposition material plates 101 and 102 that face each other, particles that have started from surfaces of the deposition material plates 101 and 102 with large energy may reach a deposition substrate 103. Also, since accelerated particles that are generated in the region of plasma formed between the deposition material plates 101 and 102 may be diffused to the right and left of the deposition material plates 101 and 102, only part of the amount of consumption of the deposition material plates 101 and 102 may be used in forming thin films.

Figure 5:
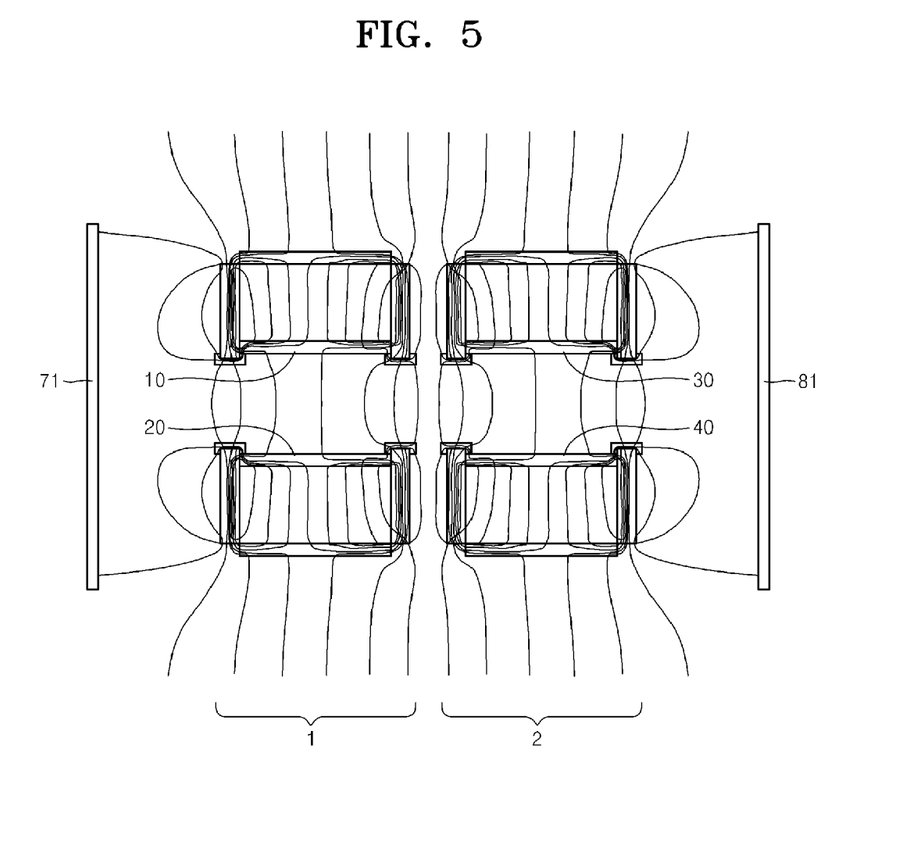
FIG. 5 illustrates the magnetic fields of the embodiment of the sputtering system of FIG. 1.

FIG. 5 illustrates the magnetic fields of the embodiment of the sputtering system of FIG. 1.

Referring to FIG. 5, the first sputter unit 1 and the second sputter unit 2 are disposed in parallel so that a thin film may be formed on the first deposition substrate 71 via an opening defined between the first deposition material plate 10 and the second deposition material plate 20, and a thin film may be formed on the second deposition substrate 81 via an opening defined between the third deposition material plate 30 and the fourth deposition material plate 40. When the openings are used by disposing the first sputter unit 1 and the second sputter unit 2 in parallel, the efficiency of material deposited may be increased to 100%. Also, since a deposition process may be simultaneously performed on two deposition substrates, the structure of equipment may be simplified, and a tact time (the time taken to perform sputtering) may be reduced.

Figure 6:
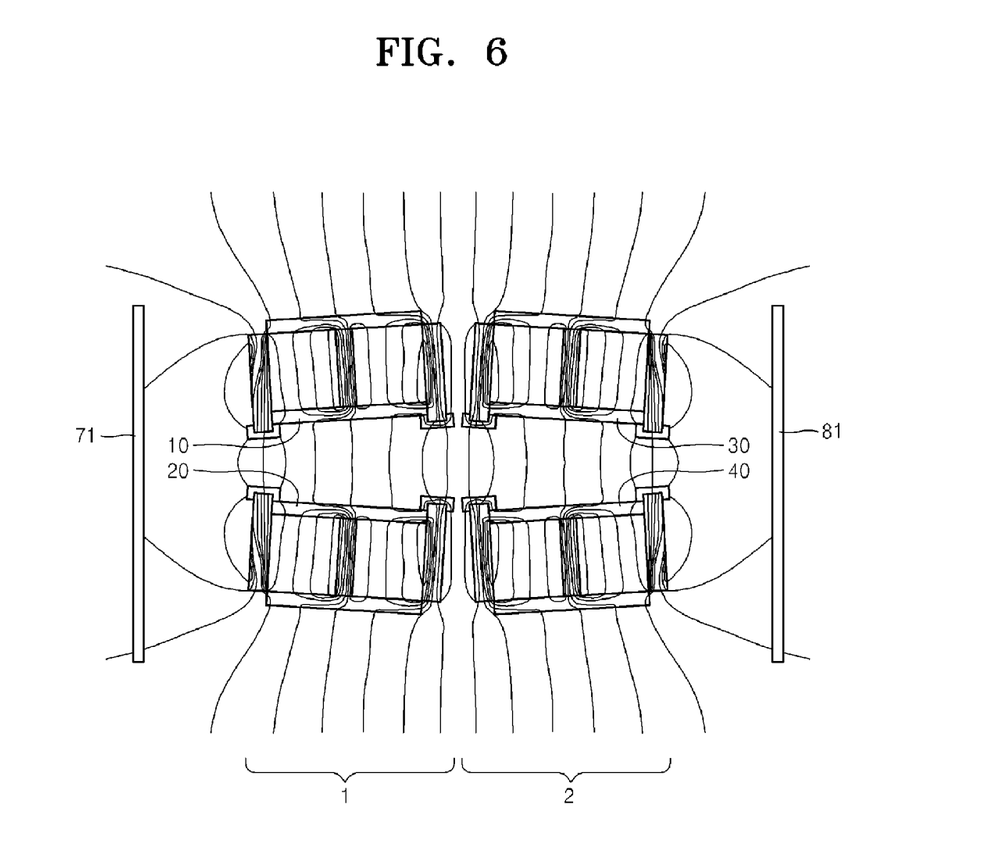
FIG. 6 illustrates the magnetic fields of the embodiment of the sputtering system of FIG. 2.

FIG. 6 illustrates the magnetic fields of the embodiment of the sputtering system of FIG. 2. When two sputter units are disposed in parallel (such as in the embodiment of FIG. 1), the magnetic flux density is increased in a central portion in which the two sputter units are adjacent to each other, due to an adjacent magnet, so that distortion of a magnetic field may occur on the surface of a deposition material plate. Thus, in order to prevent this phenomenon, the mechanical size of a magnet or the intensity of magnetism needs to be adjusted.

FIG. 6 illustrates that the embodiment of the sputtering system illustrated in FIG. 2 may alleviate the distortion of magnetic field that may occur at edges of the first, second, third, and fourth deposition material plates 10, 20, 30, and 40 of FIG. 5. When the first, second, third, and fourth deposition material plates 10, 20, 30, and 40 are disposed to be inclined at a predetermined angle so that outer edges of the first, second, third, and fourth deposition material plates 10, 20, 30, and 40 may be closer to one another and the arrangement and size of magnets are optimized, the magnetic flux density of FIG. 6 may be obtained.

In FIG. 6, the magnetic flux density may be higher than the magnetic flux density of embodiments of the sputtering systems illustrated in FIGS. 4 and 5. The region of plasma may be confined in a space in which the first, second, third, and fourth deposition material plates 10, 20, 30, and 40 of the sputtering system face one another. A deposition material plate sputter yield may be increased, and deposition efficiency may be increased. Also, since magnetic flux densities at edges of the first, second, third, and fourth deposition material plates 10, 20, 30, and 40 are increased, the degree of outflow at which the accelerated particles that are flown out of plasma may be minimized.

Also, since the surfaces of the facing first, second, third, and fourth deposition material plates 10, 20, 30, and 40 are not parallel, a possibility that high-energy particles may affect the first and second deposition substrates 71 and 81 is nearly 0%.

Figure 7:
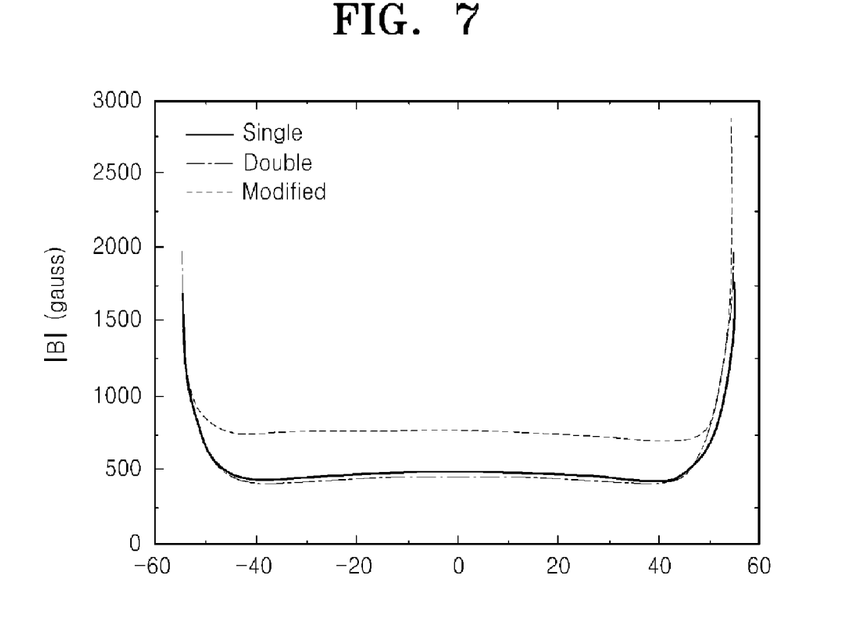
FIG. 7 is a graph showing the magnetic fields on surfaces of deposition material plates of the sputtering systems of FIGS. 4 through 6.
Figure 8:
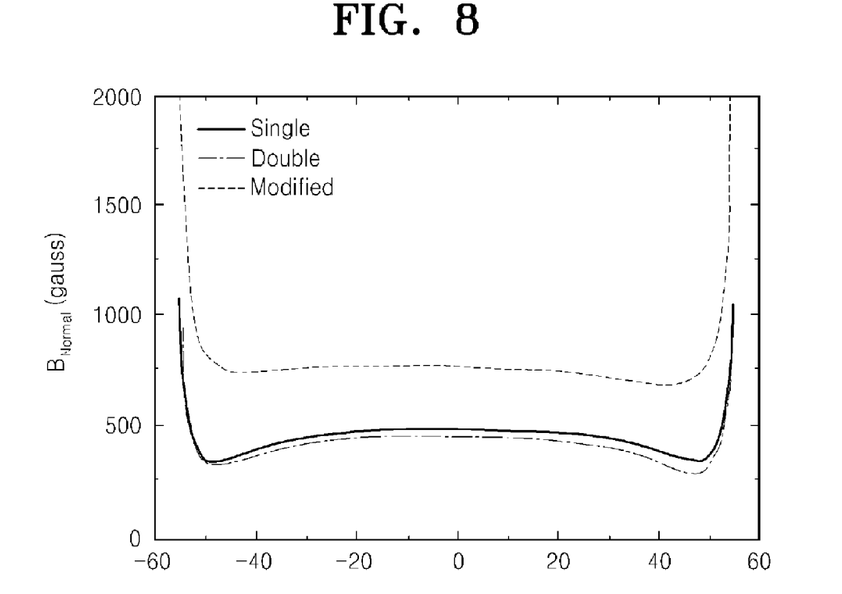
FIG. 8 is a graph showing the magnetic fields in a vertical direction of surfaces of deposition material plates of the sputtering systems of FIGS. 4 through 6.
Figure 9:
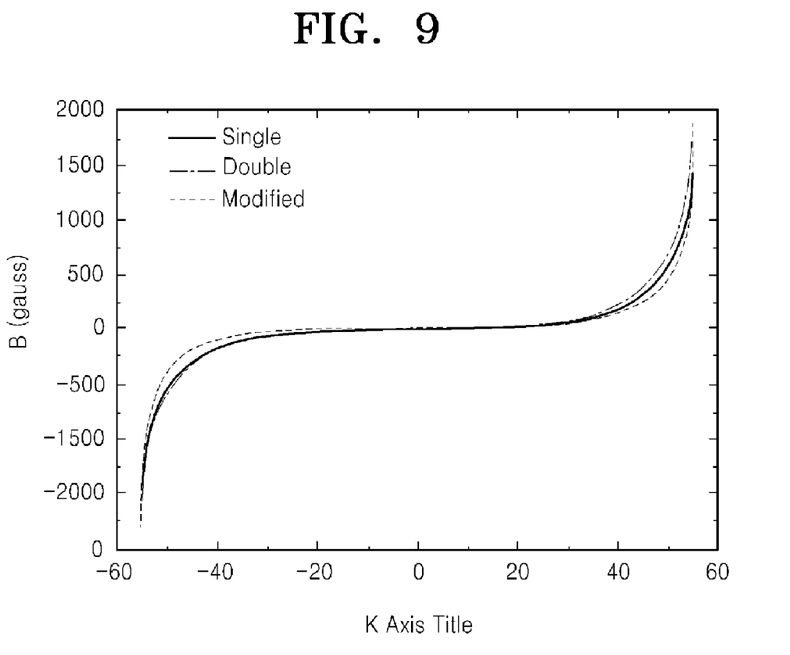
FIG. 9 is a graph showing the magnetic fields in a horizontal direction of surfaces of deposition material plates of the sputtering systems of FIGS. 4 through 6.
Figure 10:
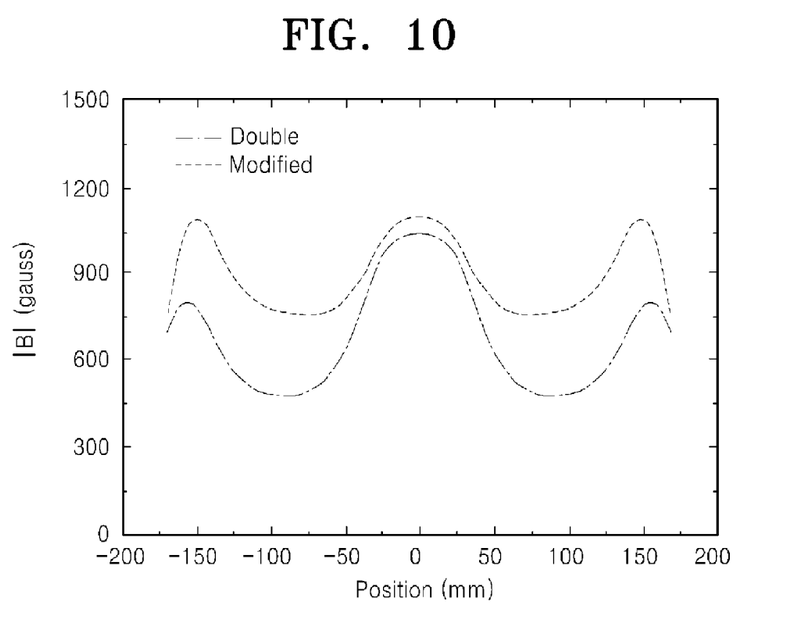
FIG. 10 is a graph showing the magnetic fields in the center of facing deposition material plates of the embodiments of the sputtering system of FIGS. 5 and 6.

FIG. 7 is a graph showing the magnetic fields on surfaces of deposition material plates of the sputtering systems of FIGS. 4 through 6. FIG. 8 is a graph showing the magnetic fields in a vertical direction of surfaces of deposition material plates of the sputtering systems of FIGS. 4 through 6. FIG. 9 is a graph showing the magnetic fields in a horizontal direction of surfaces of deposition material plates of the sputtering systems of FIGS. 4 through 6. FIG. 10 is a graph showing the magnetic fields in the center of facing deposition material plates of the embodiments of the sputtering system of FIGS. 5 and 6.

The embodiments of the sputtering systems for which measured magnetic fields are illustrated in FIGS. 7 through 10 use NbFeB-based magnets. A graph indicated by 'Single' corresponds to the comparative example system of FIG. 4, a graph indicated by 'Double' indicates a sputtering system having a double structure corresponding to the embodiment of FIG. 5, and a graph indicated by 'Modified' indicates a sputtering system having a modified double structure corresponding to the embodiment of FIG. 6.

In the 'Modified' sputtering system corresponding to the embodiment of FIG. 6, the size of magnetic fields of outer magnet portions disposed at outer edges of the deposition material plates are half the size of magnetic fields of central magnet portions disposed over the center of the deposition material plates, and are optimized.

Referring to FIG. 7, the size of magnetic fields on the surfaces of the deposition material plates in the sputtering system having the improved double structure according to the embodiment of FIG. 6 are greater than the size of magnetic fields on the surface of the deposition material plates in the sputtering system of FIG. 4. This is partly due to magnets being added to the deposition material plates, the deposition material plates being disposed to be inclined at a predetermined angle, and the outer magnet portions being disposed at the outer edges of the deposition material plates being closer to one another.

The greater magnetic fields are also partly due to a magnetic yoke plate structure that surrounds the deposition material plates being used so that the sizes of magnetic fields of vertical components at the outer edges of the deposition material plates may be increased. Even when the deposition material plates are not disposed in parallel in the sputtering system having the double structure according to the embodiment of FIG. 5, an optimized magnet arrangement is designed so that magnetic fields on the surfaces of the deposition material plates may be maintained constant, and an erosion profile of the deposition material plates may be generated in all regions of the deposition material plates.

Referring to FIG. 8, since vertical magnetic field components of the deposition material plates are large, a sputter yield of the improved sputtering system according to the embodiment of FIG. 6 is increased as compared to the sputter yields of the sputtering system of the comparative example of FIG. 4 and the sputtering system of the embodiment of FIG. 5. Thus, deposition efficiency is expected to be increased.

FIG. 9 is a graph showing a comparison of magnetic fields of target surfaces in a horizontal direction in view of magnetic fields shown in FIGS. 4 through 6. FIG. 9 shows that the magnetic fields in a horizontal direction, unlike the magnetic fields in a vertical direction, exhibit no differences.

Referring to FIG. 10, a magnetic field of the sputtering system according to the embodiment of FIG. 6 is greater than the magnetic field of the sputtering system of FIG. 5. This is partly due to the deposition material plates not being disposed in parallel, but being disposed to be closer to one another, and magnets being additionally disposed over the center of the deposition material plates. Since ions in plasma may be confined due to a strong magnetic field, accelerated ions may be more concentrated in a space in which the deposition material plates face one another. As such, the density of plasma may be increased, and ions that are flown out in a direction of a deposition substrate may be isolated.

Figure 11:
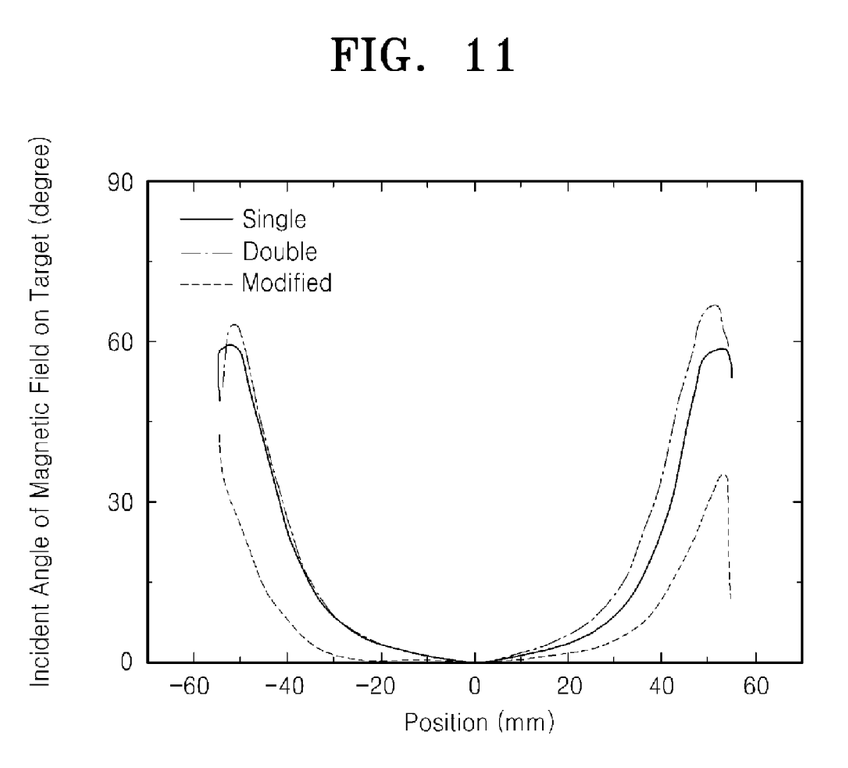
FIG. 11 is a graph showing an incident angle of magnetic fields on deposition material plates of the embodiments of the sputtering system of FIGS. 1 and 2 as a function of positions of the deposition material plates.

FIG. 11 is a graph showing an incident angle of magnetic fields on deposition material plates of the embodiments of the sputtering system of FIGS. 1 and 2 as a function of positions of the deposition material plates.

When an incident angle of accelerated particles is generally near 60 degrees during sputtering, sputter yield of the sputtering system is increased. Referring to FIG. 11, a sputter yield is high at edges of the deposition material plates in the sputtering system of the comparative example of FIG. 4 and in the sputtering system of the embodiment of FIG. 5, and thus, non-uniform erosion occurs in these systems. When magnets disposed close to edges of the deposition material plates are arranged behind the deposition material plates (not beside the deposition material plates), an erosion rate in the center of the deposition material plates is improved. However, when a magnetic flux density at the edges of the deposition material plates is increased and magnets are additionally arranged over the center of the deposition material plates, an incident angle of magnetic flux may be reduced in all regions of the deposition material plates, and thus, erosion of the deposition material plates may occur uniformly in all regions of the deposition material plates.

Figure 12:
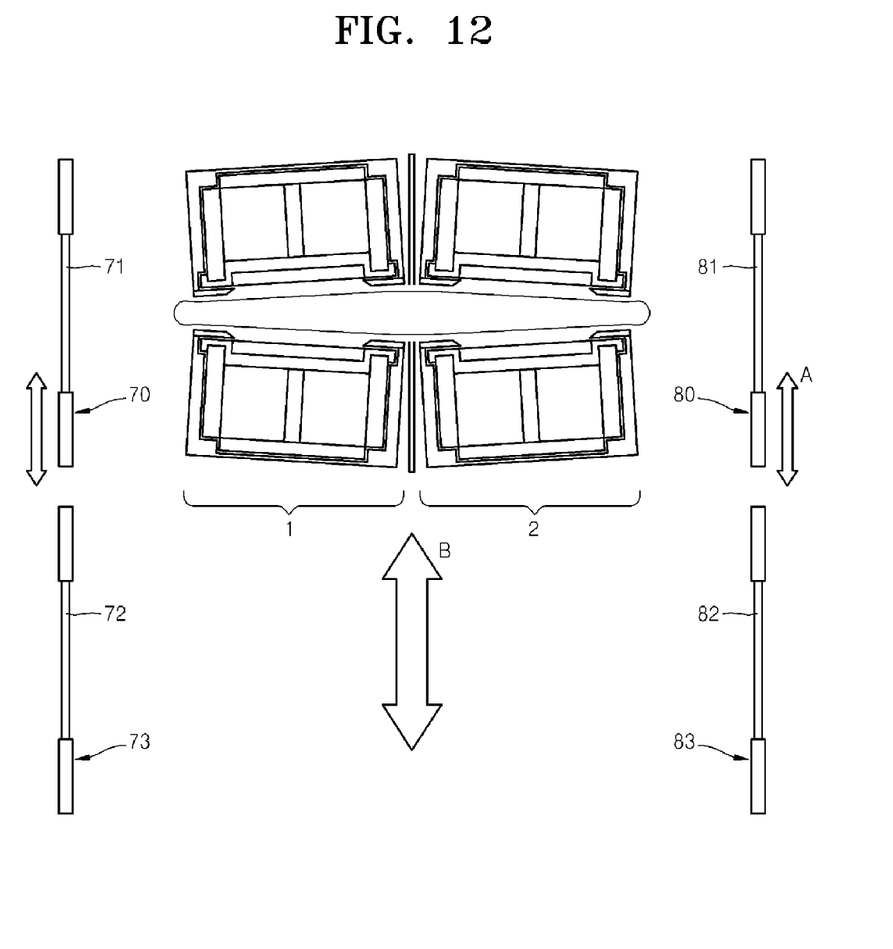
FIG. 12 is a schematic view of another embodiment of a sputtering system.

FIG. 12 is a schematic view of another embodiment of a sputtering system. Referring to FIG. 12, the embodiment of the sputtering system has a similar structure as that of the embodiment of the sputtering system illustrated in FIG. 2. However, there is a difference between FIGS. 12 and 2 in that a plurality of first substrate support units 70 and 73 are disposed in parallel and a plurality of second substrate support units 80 and 83 are disposed in parallel. Each of the first substrate support units 70 and 73 and each of the second substrate support units 80 and 83 are disposed to be movable towards a first sputter unit 1 and a second sputter unit 2 along a direction of arrow A.

In such embodiments, after a layer forming process is performed on a first deposition substrate 71 and a second deposition substrate 81, respectively, the first substrate support units 70 and 73 and the second substrate support units 80 and 83 may be moved so that a layer forming process may be performed on another set of deposition substrates, namely, the first deposition substrate 72 and the second deposition substrate 82, respectively. Thus, the embodiment of the sputtering system of FIG. 12 may perform a layer forming process on a plurality of deposition substrates continuously and thus is appropriate for mass production.

Embodiments of the sputtering system are not limited to having a structure in which the first substrate support units 70 and 73 and the second substrate support units 80 and 83 are disposed to be moveable. Other embodiments may have a modified structure. For example, in some embodiments, the plurality of first substrate support units 70 and 73 may be disposed in parallel, and the plurality of second substrate support units 80 and 83 may be disposed in parallel, and the first sputter unit 1 and the second sputter unit 2 may be disposed to be moveable to the first substrate support units 70 and 73 and the second substrate support units 80 and 83 along a direction of arrow B.

In such embodiments, when the layer forming process on the first deposition substrate 71 and the second deposition substrate 81 is completed, the first sputter unit 1 and second sputter unit 2 may be moved to the next deposition substrates, namely, the first deposition substrate 72 and the second deposition substrate 82 so that a layer forming process on the first deposition substrate 72 and the second deposition substrate 82 may be continuously performed.

In some embodiments, the first sputter unit 1 and the second sputter unit 2 do not operate simultaneously. For example, voltage may be applied to only the first sputter unit 1, and voltage to the second sputter unit 2 may be cut off so that a layer forming process may be performed on only the first deposition substrates 71 and 72 and the efficiency of equipment operation may be improved.

Conventional sputtering systems have a single structure using a one directional opening, and the rate of using material of the deposition material plates is a maximum of ½ in such systems. Embodiments of the sputtering system currently disclosed use bi-directional openings, and the rate of using material of the deposition material plates may thus be expected to be about 100%. Also, a layer forming process on two deposition substrates may be simultaneously performed in such embodiments, so that a tact time (time taken to perform sputtering) during equipment construction may be reduced to about half.

Deposition material plates that face one another are not disposed in parallel but are disposed to be inclined at a predetermined angle so that the deposition material plates may be closer to one another in the openings of the sputter units that are oriented to the deposition substrate and the magnetic fields at outer edges of the deposition material plates may be increased. As such, the region of plasma may be confined in the sputtering system so that damage to the deposition substrate may be prevented. Thus, an inorganic layer and electrodes may be formed without any damage to a substrate on which an organic layer is deposited, or the like.

When the facing deposition material plates are disposed to be inclined at a predetermined angle so that directions of the deposition material plates may be oriented to the center of the sputtering system, particles with high energy that are reflected from surfaces of the deposition material plates may be confined in the sputtering system, and thus, strong shock on the surface of the substrate may be prevented and sputtering with no damage may be performed.

Also, when the facing deposition material plates are disposed to be inclined at a predetermined angle and the arrangement of magnets and the sizes of magnetic fields are optimized, the magnetic fields are not distorted, and a magnetic flux density of the sputtering system may be increased. Thus, the density of plasma may be increased, and excellent deposition efficiency may be obtained.

The sputtering system according to embodiments of the present invention may perform large-sized deposition with no damage for electrodes and an inorganic layer of a general flat panel display (FPD) device and electrodes of an organic light emitting diode (OLED) display device. A deposition substrate is not damaged so that embodiments of the sputtering system may be used in performing large-scale thin film encapsulation process of an organic electroluminescent light emitting device and in depositing a barrier film such as $Al_2O_3$, $SiN_X$ or the like with no damage.

In embodiments of the sputtering system of the present invention, sputter units having facing deposition material plates are disposed in parallel, and gas is supplied to a space defined by the deposition material plates via gas supply pipes between the sputter units so that uniform deposition may be performed on a deposition substrate. Thin film deposition may be simultaneously performed on two deposition substrates via openings formed in both sides of the sputter units. A region of plasma may be defined in a space in which the deposition material plates face one another so that particles with high energy may not collide with the deposition substrate and damage to the deposition substrate may be greatly reduced.

While this disclosure has been described in connection with certain exemplary embodiments, it is to be understood by those of ordinary skill in the art that various changes in form and details may be made without departing from the spirit and scope of the present invention.

What is claimed is:

1. A sputtering system comprising:
   a first sputter unit comprising:
      a first deposition material plate;

a second deposition material plate, wherein the first and second deposition material plates face each other; and
a first magnetic field generator disposed behind each of the first deposition material plate and the second deposition material plate, configured to generate a magnetic field;
a second sputter unit comprising:
a third deposition material plate; disposed next to the first deposition material plate;
a fourth deposition material plate, disposed next to the second deposition plate, wherein the third and fourth deposition material plates face each other; and
a second magnetic field generator disposed behind each of the third deposition material plate and the fourth deposition material plate, configured to generate a magnetic field;
a first gas supply pipe disposed between the first and third deposition material plates, configured to discharge gas to the second and fourth deposition material plates;
a second gas supply pipe disposed between the second fourth deposition material plates, configured to discharge gas to the first and third deposition material plates;
a first substrate support unit, configured to support a first deposition substrate, oriented toward outer edges of the first and second deposition material plates; and
a second substrate support unit, configured to support a second deposition substrate, oriented toward outer edges of the third and fourth deposition material plates,
wherein the outer edges of the first and second deposition material plates that are closest to the substrate, and are oriented toward the first substrate support unit, are closer to each other than the inner edges of the first and second deposition material plates, and the outer edges of the third and fourth deposition material plates that are closest to the substrate, and are oriented toward the second substrate support unit are closer to each other than the inner edges of the third and fourth deposition material plates.

2. The sputtering system of claim 1, wherein the first magnetic field generator comprises an outer magnet portion disposed behind each of the first and second deposition material plate, and the second magnetic field generator comprises an outer magnet portion disposed behind each of the third and fourth deposition material plates.

3. The sputtering system of claim 1, wherein the first magnetic field generator comprises a central magnet portion disposed over a center of a rear surface of each of the first and second deposition material plates, and wherein the second magnetic field generator comprises a central magnet portion disposed over a center of a rear surface of each of the third and fourth deposition material plates.

4. The sputtering system of claim 3, wherein the outer magnet portion of each of the first and second magnetic field generators generates a stronger magnetic field than a magnetic field generated by the central magnet portion.

5. The sputtering system of claim 4, wherein each of the magnetic field generators further comprises a yoke plate disposed between the first and second or third and fourth deposition material plates and the outer magnet portions, each of said yoke plates configured to deflect a magnetic field.

6. The sputtering system of claim 5, wherein each yoke plate comprises a groove for the outer magnet portion to surround deposition material plate.

7. The sputtering system of claim 1, wherein the front surfaces of the first, second, third and fourth deposition material plates are configured with adjustable inclination angles.

8. The sputtering system of claim 1, further comprising shield units disposed in the front of edges of each of the first, second, third and fourth deposition material plates, configured to generate discharge to the respective material plates.

9. The sputtering system of claim 8, wherein each of the shield units comprises the same material as a material to be deposited on the first and second deposition substrates by the system.

10. The sputtering system of claim 8, wherein at least one of a direct current (DC) voltage, a pulse DC voltage, and a radio frequency (RF) voltage is applied to the shield units and the first, second, third and fourth deposition material plates.

11. The sputtering system of claim 1, further comprising a plurality of first substrate support units and a plurality of second substrate support units disposed in parallel, and are configured to be moveable toward the first sputter unit and the second sputter unit.

12. The sputtering system of claim 1, further comprising a first plurality of substrate support units and a second plurality of substrate support units, disposed in parallel, and wherein the first sputter unit and the second sputter unit are configured to be sequentially moveable toward consecutive substrate support units of the first plurality of substrate support units and consecutive substrate support units of the second plurality of substrate support units.

13. A sputtering system comprising:
a first sputter unit comprising:
a first and a second deposition material plate facing each other; and
a first magnetic field generator comprising:
an outer magnet portion disposed behind each plate;
a central magnet portion disposed over a center of a rear surface of each plate, wherein the outer magnet portion is configured to generate a stronger magnetic field than the central magnet portion; and
a yoke plate, comprising a groove for the outer magnet portion to surround the deposition material plate, disposed between each plate and the outer magnet portion, configured to deflect a magnetic field;
a second sputter unit comprising:
a third and a fourth deposition material plate facing each other, and a second magnetic field generator comprising:
an outer magnet portion disposed behind each plate;
a central magnet portion disposed over a center of a rear surface of each plate, wherein the outer magnet portion is configured to generate a stronger magnetic field than the central magnet portion; and
a yoke plate, comprising a groove for the outer magnet portion to surround the deposition material plate, disposed between each plate and the outer magnet portion, configured to deflect a magnetic field;
wherein the third deposition material plate is placed next to the first deposition plate and the fourth deposition material plate is placed next to the second deposition plate; and
shield units disposed in front of edges of each of the first, second, third and fourth deposition material plates, configured to generate discharge to the respective material plates, wherein the shield units comprise the same material as a material to be deposited on the first and second deposition substrates by the system;
wherein a voltage is supplied to said system in a form selected from the group consisting of a direct current (DC) voltage, a pulse DC voltage, and a radio frequency (RF) voltage applied to the shield units and the first, second, third and fourth deposition material plates, wherein the outer edges of the first and second deposition material plates that are closest to the substrate, and are orientated toward the first substrate support unit, are closer to each other than the inner edges of the first and second deposition material plates, and the outer edges of the third and fourth deposition material plates that are closest to the substrate, and are oriented toward the second substrate support unit are closer to each other than the inner edges of the third and fourth deposition material plates.

14. The sputtering system of claim 13, wherein the front surfaces of the first, second, third and fourth deposition material plates are configured with adjustable inclination angles.

15. The sputtering system of claim 13, further comprising a first gas supply pipe disposed between the first and third deposition material plates, configured to discharge gas to the second and fourth deposition material plates;

a second gas supply pipe disposed between the second fourth deposition material plates, configured to discharge gas to the first and third deposition material plates;

a first substrate support unit, configured to support a first deposition substrate, oriented toward outer edges of the first and second deposition material plates; and a second substrate support unit, configured to support a second deposition substrate, oriented toward outer edges of the third and fourth deposition material plates.

16. The sputtering system of claim 13, further comprising a first plurality of substrate support units and a second plurality of substrate support units, disposed in parallel, and wherein the first sputter unit and the second sputter unit are configured to be sequentially moveable toward the consecutive ones of the first plurality of substrate support units and the second plurality of substrate support units.

* * * * *